(12) United States Patent
Huang (10) Patent No.: US 8,022,730 B2
(45) Date of Patent: Sep. 20, 2011

(54) DRIVING CIRCUIT WITH SLEW-RATE ENHANCEMENT CIRCUIT

(75) Inventor: Hung-Yu Huang, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 22 days.

(21) Appl. No.: 12/577,851

(22) Filed: Oct. 13, 2009

(65) Prior Publication Data

US 2011/0084733 A1    Apr. 14, 2011

(51) Int. Cl.
*H03K 19/094* (2006.01)
(52) U.S. Cl. .............. 326/86; 326/82; 326/84; 326/62; 327/108; 327/109; 327/112
(58) Field of Classification Search .......... 326/6, 82–87, 326/89–91, 29; 327/108, 109, 112, 51–57, 327/170
See application file for complete search history.

(56) References Cited

U.S. PATENT DOCUMENTS

| | | | | |
|---|---|---|---|---|
| 4,551,636 A * | 11/1985 | Andrews et al. | ............. | 327/333 |
| 5,121,082 A * | 6/1992 | Matsuzawa | .................... | 330/293 |
| 5,442,309 A * | 8/1995 | Cabler | ......................... | 327/108 |
| 5,656,947 A * | 8/1997 | Opris | ............................. | 326/26 |
| 5,742,193 A * | 4/1998 | Colli et al. | .................... | 327/170 |
| 5,828,245 A * | 10/1998 | Brambilla et al. | ............ | 327/108 |
| 5,835,999 A * | 11/1998 | Grosspietsch et al. | ........ | 327/328 |
| 5,939,909 A * | 8/1999 | Callahan, Jr. | ................. | 327/108 |
| 5,959,475 A * | 9/1999 | Zomorrodi | .................... | 327/112 |
| 6,215,338 B1 * | 4/2001 | Gervasi et al. | ................ | 327/108 |
| 6,323,703 B1 * | 11/2001 | Fotouhi | ......................... | 327/112 |
| 6,341,135 B1 * | 1/2002 | Fawal et al. | ................... | 370/419 |
| 6,351,137 B1 * | 2/2002 | Hariton | ........................... | 326/30 |
| 6,400,177 B1 * | 6/2002 | Yoshizaki | ....................... | 326/30 |
| 6,429,700 B1 * | 8/2002 | Yang | ............................. | 327/108 |
| 6,486,821 B1 * | 11/2002 | Aude et al. | .................... | 341/172 |
| 6,535,020 B1 * | 3/2003 | Yin | ................................. | 326/83 |
| 6,580,286 B1 * | 6/2003 | Tennen | .......................... | 326/30 |
| 6,624,671 B2 * | 9/2003 | Fotouhi | ......................... | 327/112 |
| 6,639,433 B1 * | 10/2003 | Heckenbach | ................. | 327/108 |
| 6,646,463 B1 * | 11/2003 | Hariton | .......................... | 326/30 |
| 6,700,422 B2 * | 3/2004 | Tang et al. | .................... | 327/170 |
| 6,897,717 B1 * | 5/2005 | Eddleman et al. | ............ | 327/543 |
| 6,900,663 B1 * | 5/2005 | Roper et al. | .................... | 326/83 |
| 6,900,672 B2 * | 5/2005 | Callahan, Jr. | ................. | 327/108 |
| 6,922,077 B2 * | 7/2005 | Chandler et al. | ............... | 326/30 |
| 7,071,739 B1 * | 7/2006 | Duzevik et al. | ............... | 327/108 |
| 7,091,754 B2 * | 8/2006 | Lu et al. | ......................... | 327/108 |
| 7,167,041 B2 * | 1/2007 | Khalid | .......................... | 327/541 |
| 7,400,170 B2 * | 7/2008 | Bitting | ............................ | 326/82 |
| 7,579,873 B1 * | 8/2009 | Jiang et al. | ..................... | 326/83 |
| 7,633,482 B2 * | 12/2009 | Chang et al. | .................. | 345/100 |

(Continued)

*Primary Examiner* — Shawki Ismail
*Assistant Examiner* — Matthew C Tabler
(74) *Attorney, Agent, or Firm* — Thomas|Kayden (57) ABSTRACT

A driving auxiliary circuit receiving an input voltage to control an output voltage of an operational amplifier via a first switch and a second switch is provided. A pull-low circuit turns on the first switch, including a first input terminal coupled to a high voltage source providing a high voltage and a first output terminal for controlling the voltage level of the output voltage. The output voltage is charged to be equal to the input voltage when the input voltage exceeds the output voltage. A pull-high circuit turns on the second switch, including a second input terminal coupled to the high voltage source providing the high voltage and a second output terminal for controlling the voltage level of the output voltage. The output voltage is discharged to be equal to the input voltage when the output voltage exceeds the input voltage.

15 Claims, 6 Drawing Sheets

U.S. PATENT DOCUMENTS

| | | | |
|---|---|---|---|
| 7,659,755 B1 * | 2/2010 | Kim | 327/108 |
| 7,808,281 B1 * | 10/2010 | Hsiao | 326/115 |
| 7,830,177 B2 * | 11/2010 | Isik et al. | 326/86 |
| 2002/0017931 A1 * | 2/2002 | Kadanka et al. | 327/112 |
| 2002/0070771 A1 * | 6/2002 | Garrett et al. | 327/108 |
| 2005/0122135 A1 * | 6/2005 | Walker | 326/86 |
| 2005/0285637 A1 * | 12/2005 | Lu et al. | 327/108 |
| 2007/0024328 A1 * | 2/2007 | Shin | 327/112 |

* cited by examiner

DRIVING CIRCUIT WITH SLEW-RATE ENHANCEMENT CIRCUIT

BACKGROUND OF THE INVENTION

1. Field of the Invention

The present invention relates to a driving circuit, and in particular relates to driving circuit with a high-driving auxiliary circuit.

2. Description of the Related Art

In a conventional operational amplifier, high slew rate is achieved by increasing the current or decreasing compensation capacitance. If the operational amplifier is used to drive a pixel in an LCD panel, the only way to increase slew rate is to increase the driving current. However, increasing the driving current may increase static current consumption and deteriorate the stability of the operational amplifier.

BRIEF SUMMARY OF THE INVENTION

An embodiment of a driving circuit is provided, comprising an operational amplifier comprising a positive input terminal receiving an input voltage and a negative input terminal coupled to an output terminal of the operational amplifier for outputting an output voltage; a PMOS transistor comprising a first source terminal coupled to a high voltage source providing a high voltage, a first gate terminal coupled to a first node of the operational amplifier, and a first drain terminal coupled to the output terminal of the operational amplifier; an NMOS transistor comprising a second source terminal coupled to a low voltage source that is grounded, a second gate terminal coupled to a second node of the operational amplifier, and a second drain terminal coupled to the output terminal of the operational amplifier; and a driving auxiliary circuit receiving the input voltage and the output voltage and coupled to the first node and the second node, wherein the driving auxiliary circuit pulls down the voltage level of the first node and second node to a first voltage level when the input voltage exceeds the output voltage, and the driving auxiliary circuit pulls up the voltage level of the first node and second node to a second voltage level when the output voltage exceeds the input voltage.

Another embodiment of a driving auxiliary circuit is provided, comprising: a pull-low circuit to turn on the first switch, comprising a first input terminal coupled to a high voltage source providing a high voltage and a first output terminal for controlling the voltage level of the output voltage, wherein the output voltage is charged to be equal to the input voltage when the input voltage exceeds the output voltage; and a pull-high circuit to turn on the second switch, comprising a second input terminal coupled to a high voltage source providing a high voltage and a second output terminal for controlling the voltage level of the output voltage, wherein the output voltage is discharged to be equal to the input voltage when the output voltage exceeds the input voltage.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
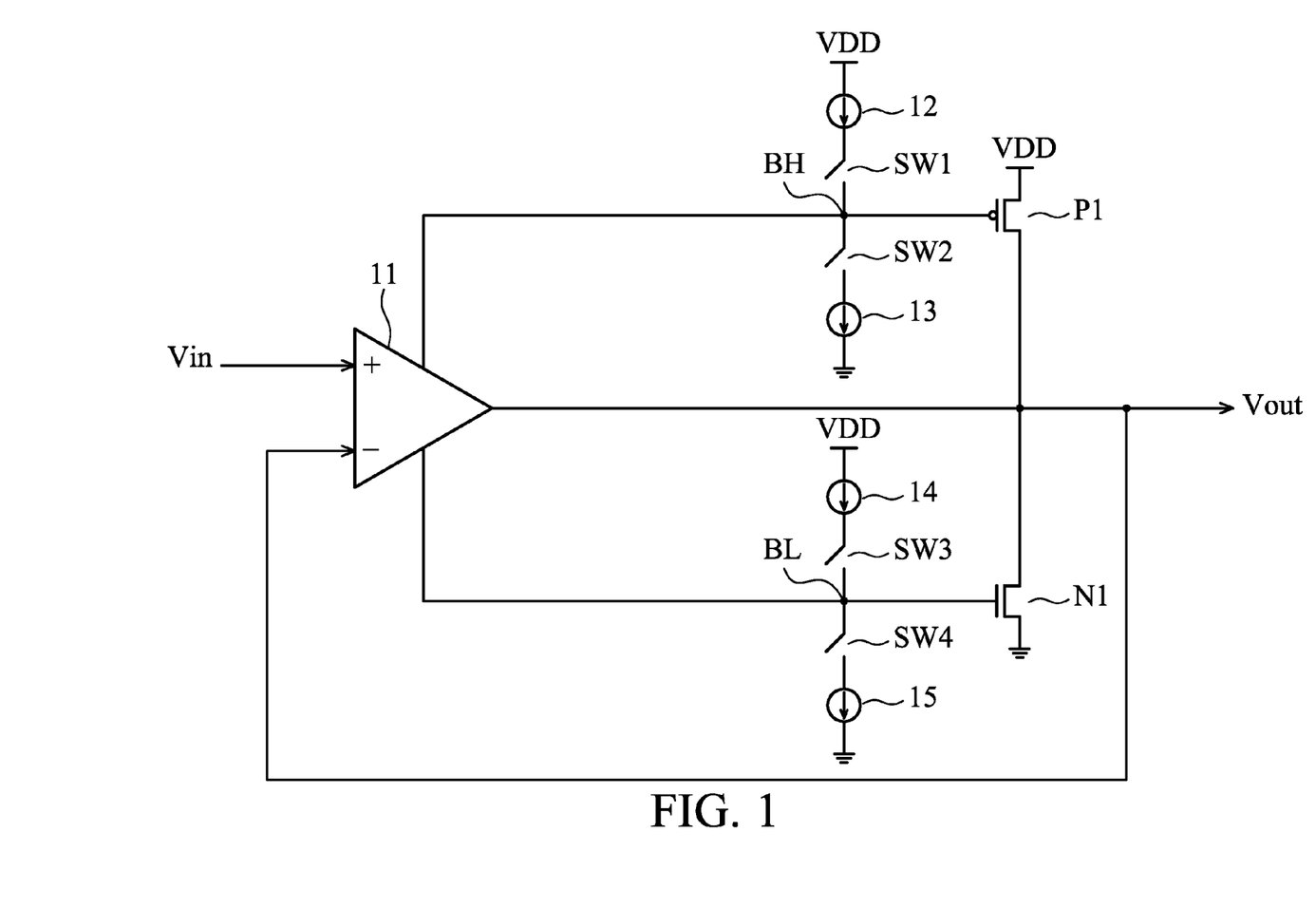
FIG. 1 is a schematic diagram of an embodiment of an operational amplifier with high slew rate circuit according to the invention.
Figure 2:
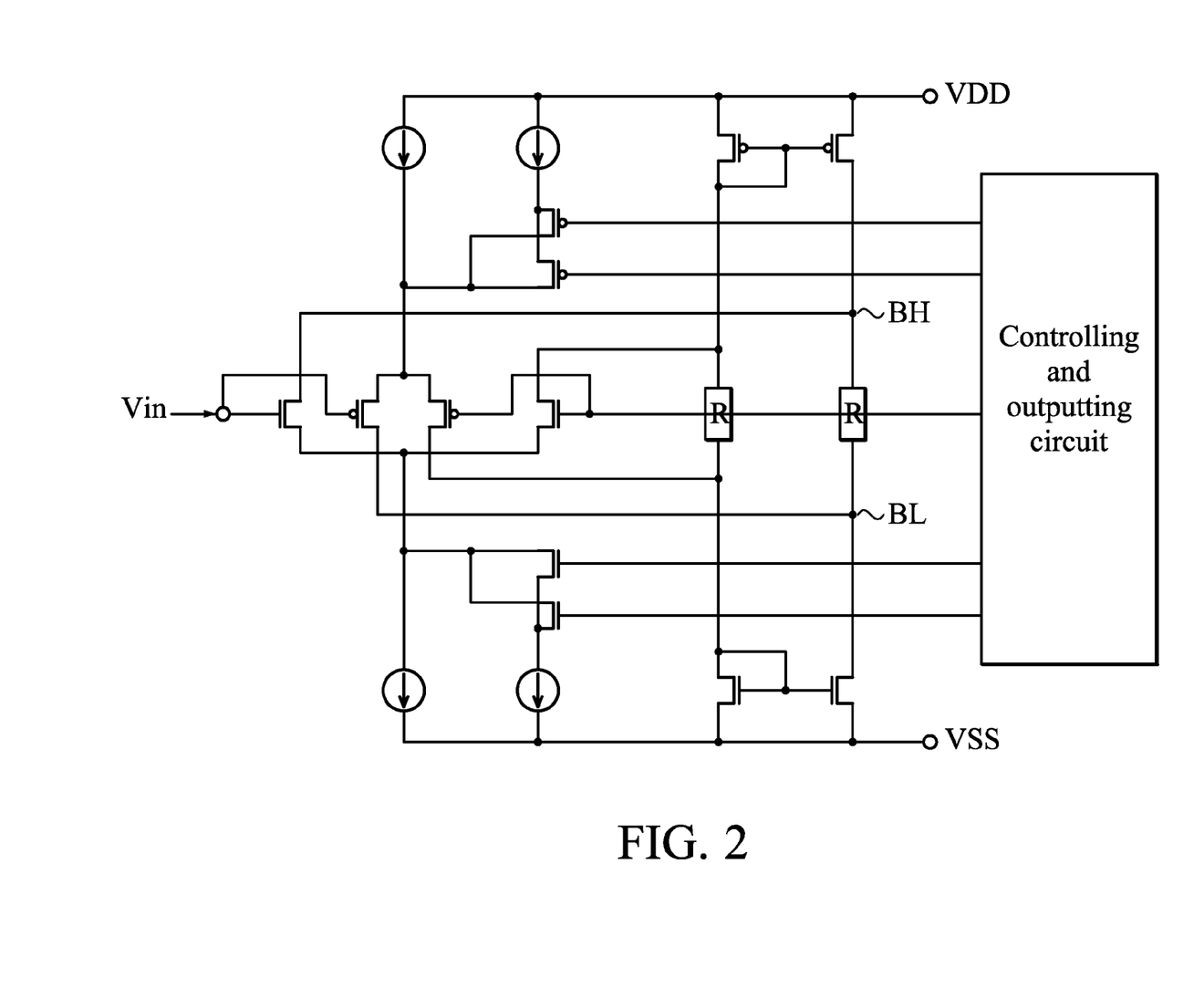
FIG. 2 is a circuit diagram of an operational amplifier according to an embodiment of the invention.

FIG. 1 is a schematic diagram of an embodiment of an operational amplifier with high slew rate circuit according to the invention. The operational amplifier 11 comprises a positive input terminal receiving an input voltage Vin and a negative input terminal coupled to the output terminal of the operational amplifier 11. The PMOS transistor P1 comprises a source terminal that receives a voltage VDD, a drain terminal coupled to the output terminal of the operational amplifier 11, and a gate terminal coupled to node BH. The NMOS transistor N1 comprises a source terminal that is grounded, a drain terminal coupled to the output terminal of the operational amplifier 11, and a gate terminal coupled to node BL. FIG. 2 shows the nodes BH and BL in an embodiment of the operational amplifier 11.

The first terminal of the first current source 12 is coupled to a high voltage source providing the voltage VDD and the second terminal of the first current source 12 is coupled to the first terminal of the switch SW1. The second terminal of the switch SW1 is coupled to the node BH. The first terminal of the switch SW2 is coupled to the node BH and the second terminal of the switch SW2 is coupled to the first terminal of the second current source 13. The second terminal of the second current source 13 is grounded. The first terminal of the third current source 14 receives the voltage VDD, and the second terminal of the third current source 14 is coupled to the first terminal of the switch SW3. The second terminal of the switch SW3 is coupled to the node BL. The first terminal of the switch SW4 is coupled to the node BL and the second terminal of the switch SW4 is coupled to the first terminal of the fourth current source 15. The second terminal of the fourth current source 15 is grounded.

When the input voltage Vin rapidly increases, the switches SW2 and SW4 are turned on and the switches SW1 and SW3 are turned off. The voltage level of nodes BH and BL are also rapidly pulled to a low voltage level. The NMOS transistor N1 is turned off, the PMOS transistor P1 is turned on, and the voltage level of the output terminal of the operational amplifier 11 is charged to be equal to voltage Vin. When the input voltage Vin rapidly decreases, the switches SW2 and SW 4 are turned off and the switches SW1 and SW3 are turned on. The voltage level of nodes BH and BL are rapidly pulled to a high voltage level. The PMOS transistor P1 is turned off, the NMOS transistor N1 is turned on, and the voltage level of the output terminal of the operational amplifier 11 is discharged to be equal to voltage Vin.

The first current source 12, second current source 13, the third current source 14 and the fourth current source 15 are used to quickly charge or discharge the voltage of the nodes BH and BL to ensure that the PMOS transistor P1 or NMOS transistor N1 can be turned off. Thus, the slew rate of the operational amplifier 11 is improved.

Figure 3:
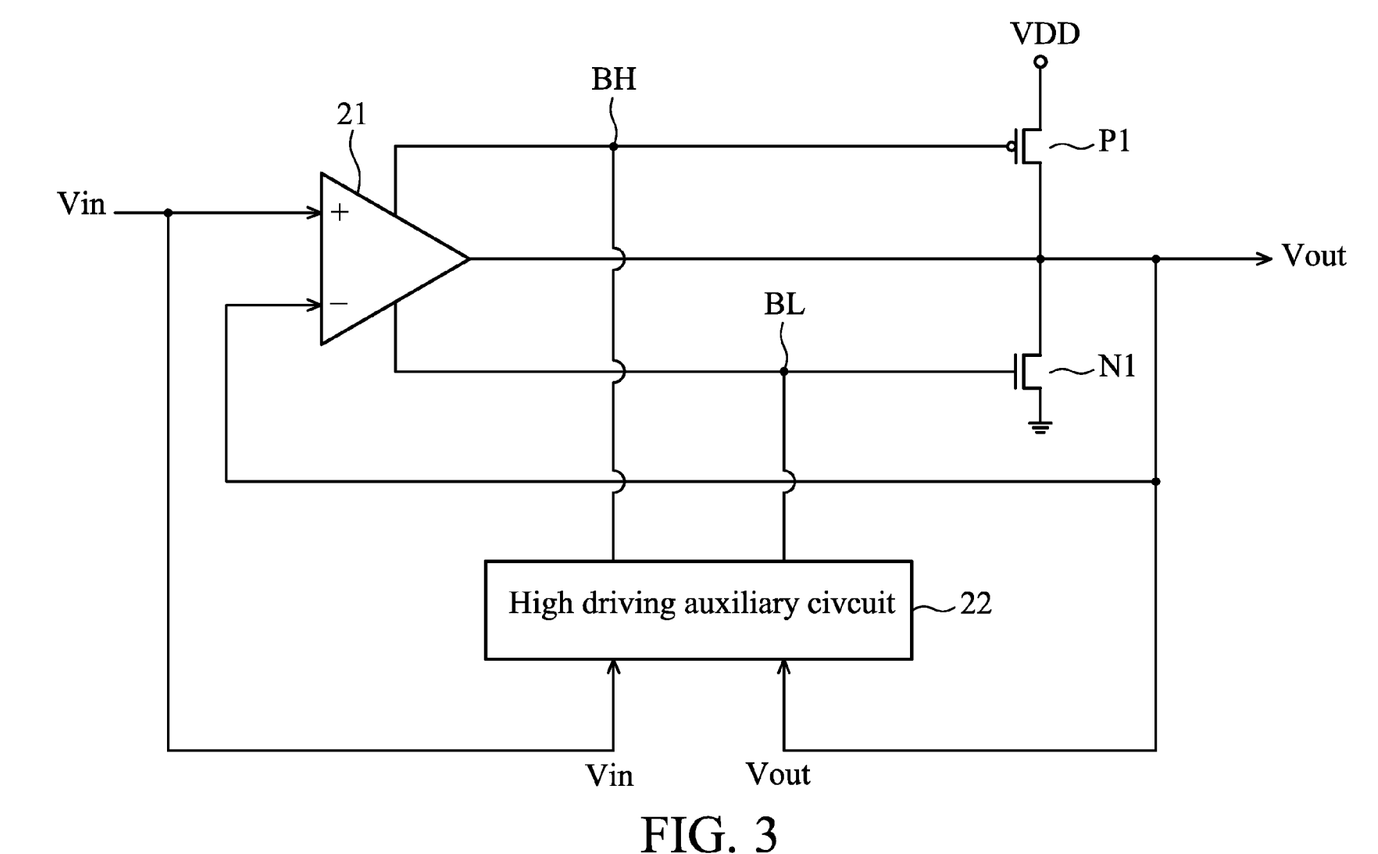
FIG. 3 is a schematic diagram of another embodiment of an operational amplifier with high slew rate circuit according to the invention.

FIG. 3 is a schematic diagram of another embodiment of an operational amplifier with high slew rate circuit according to the invention. The operational amplifier 21 comprises a positive input terminal receiving an input voltage Vin and a negative input terminal coupled to the output terminal of the operational amplifier 21. The high driving auxiliary circuit 22 receives the input voltage Vin and the output voltage Vout, and has two output terminals respectively coupled to the nodes BH and BL, wherein the nodes BH and BL are respectively coupled to the nodes inside of the circuit of the operational amplifier 21, as shown in FIG. 2. The PMOS transistor P1 comprises a source terminal that receives a voltage VDD, a drain terminal coupled to the output terminal of the operational amplifier 21, and a gate terminal coupled to node BH. The NMOS transistor N1 comprises a source terminal that is grounded, a drain terminal coupled to the output terminal of the operational amplifier 21, and a gate terminal coupled to node BL When the input voltage Vin rapidly increases, the high driving auxiliary circuit 22 rapidly pulls the voltage levels of nodes BH and BL to a low voltage level, such as a ground level. The NMOS transistor N1 is turned off, the PMOS transistor P1 is turned on, and the voltage level of the output terminal of the operational amplifier 21 is charged to be equal to voltage Vin. When the input voltage Vin rapidly decreases, the high driving auxiliary circuit 22 rapidly pulls the voltages level of nodes BH and BL to a high voltage level, such as voltage VDD. The NMOS transistor N1 is turned on, the PMOS transistor P1 is turned off, and the voltage level of the output terminal of the operational amplifier 21 is discharged to be equal to voltage Vin. By the aid of the high driving auxiliary circuit 22, the slew rate of the operational amplifier 21 is improved, i.e., the rising time or falling time of voltage level of the output terminal of the operational amplifier 21 is decreased.

In one embodiment, the high driving auxiliary circuit 22 comprises two driving circuit respectively controlling the nodes BH and BL to be at a high voltage level or a low voltage level. For illustration of the detailed circuitry of the embodiments of the invention, reference may be made to FIGS. 4 and 5.

Figure 4:
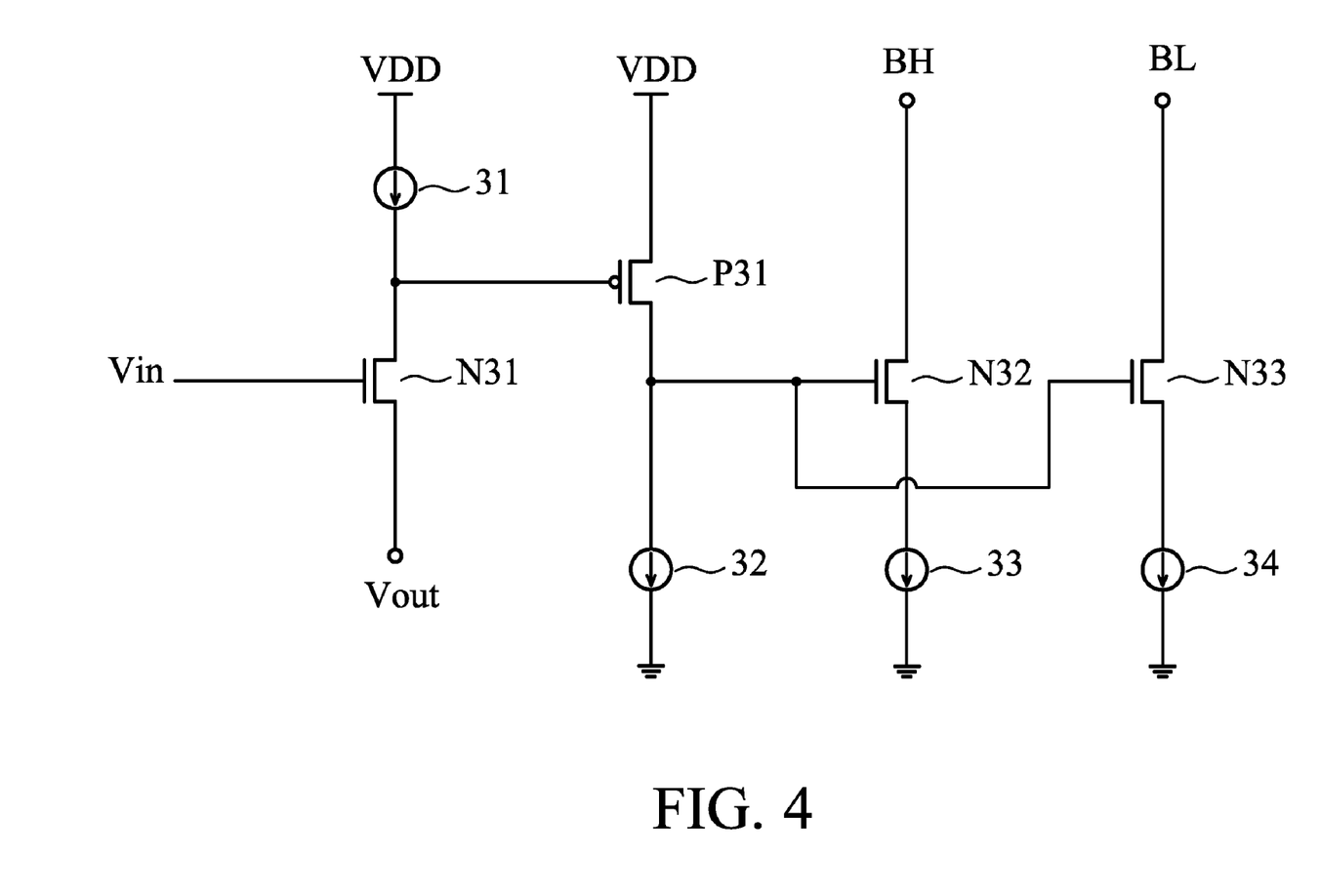
FIG. 4 is a circuit diagram of a pull-low circuit of the high driving auxiliary circuit according to one embodiment of the invention.

FIG. 4 is a circuit diagram of a pull-low circuit of the high driving auxiliary circuit according to one embodiment of the invention. The first current source 31 has a first terminal that receives the voltage VDD and a second terminal coupled to the drain of the NMOS transistor N31. The gate of the NMOS transistor N31 receives the input voltage Vin and the source of the transistor N31 is coupled to the output terminal, such as the output terminal of operational amplifier 21. The source of PMOS transistor P31 receives the voltage VDD, the gate of PMOS transistor P31 is coupled to the drain of the NMOS transistor N31, and the drain of the PMOS transistor P31 is coupled to a first terminal of the second current 32, wherein the second terminal of the second current 32 is grounded. The drain of NMOS transistor N32 is coupled to node BH, the gate of NMOS transistor N32 is coupled to the drain of the PMOS transistor P31, and the source of the NMOS transistor N32 is coupled to the first terminal of the third current source 33, wherein the second terminal of the third current source 33 is grounded. The drain of NMOS transistor N33 is coupled to node BL, the gate of NMOS transistor N33 is coupled to the drain of the PMOS transistor P31, and the source of the NMOS transistor N33 is coupled to the first terminal of the fourth current source 34, wherein the second terminal of the fourth current source 34 is grounded.

When the input voltage Vin increases to higher than the voltage Vout, the NMOS transistor N31 is turned on, and the PMOS transistor P31 is turned on because the voltage of the gate of PMOS transistor P31 is decreased. In addition, the turned-on PMOS transistor P31 causes the voltage level of the gates of NMOS transistors N32 and N33 to a high voltage level. Thus, NMOS transistors N32 and N33 are turned on, and the voltage level of nodes BH and BL is pulled down to a low voltage level. When the voltage Vout is equal to the input voltage Vin, the pull-low circuit shown in FIG. 4 is turned off.

Figure 5:
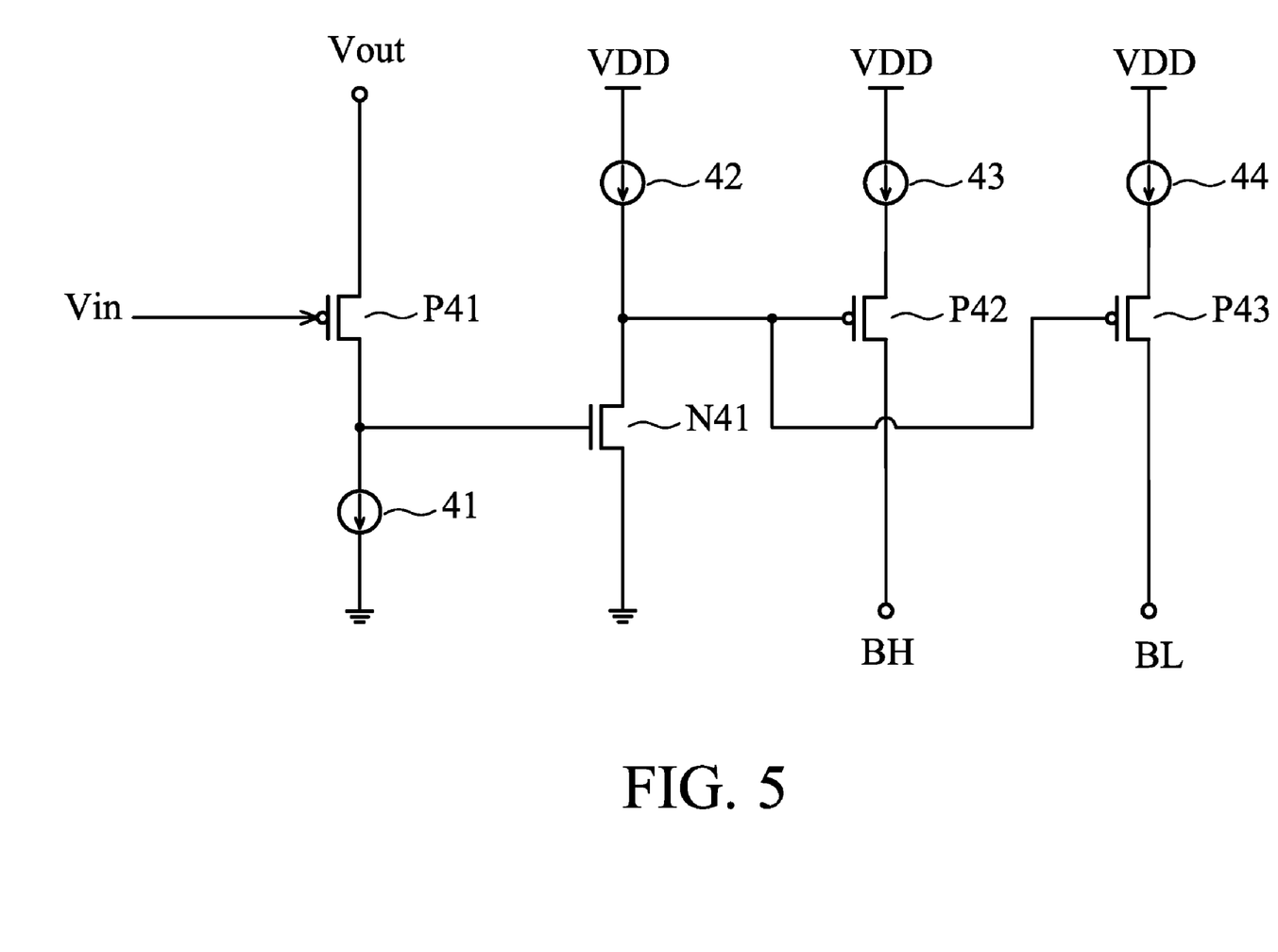
FIG. 5 is a circuit diagram of a pull-high circuit of the high driving auxiliary circuit according to one embodiment of the invention.

FIG. 5 is a circuit diagram of a pull-high circuit of the high driving auxiliary circuit according to one embodiment of the invention. The first current source 41 has a first terminal that is grounded and a second terminal coupled to the drain of the PMOS transistor P41. The gate of the PMOS transistor P41 receives the input voltage Vin and the source of the transistor N31 is coupled to the output terminal, such as the output terminal of operational amplifier 21. The source of NMOS transistor N41 is grounded, the gate of NMOS transistor N41 is coupled to the drain of the PMOS transistor P41, and the drain of the NMOS transistor N41 is coupled to a first terminal of the second current 42, wherein the second terminal of the second current 42 receives voltage VDD. The drain of PMOS transistor P42 is coupled to node BH, the gate of PMOS transistor P42 is coupled to the drain of the NMOS transistor N41, and the source of the PMOS transistor P42 is coupled to the first terminal of third current source 43, wherein the second terminal of third current source 43 receives voltage VDD. The drain of PMOS transistor P43 is coupled to node BL, the gate of PMOS transistor P43 is coupled to the drain of the NMOS transistor N41, and the source of the PMOS transistor P43 is coupled to the first terminal of fourth current source 44, wherein the second terminal of fourth current source 44 receives voltage VDD.

When the input voltage Vin decreases to lower than the voltage Vout, the PMOS transistor P41 is turned on, and the NMOS transistor N41 is turned on because the voltage of the gate of NMOS transistor N41 is increased. In addition, the turned-on NMOS transistor N41 causes the voltage level of the gates of PMOS transistors P42 and P43 to a low voltage level. Thus, PMOS transistors P42 and P43 are turned on, and the voltage level of nodes BH and BL is pulled up to a high voltage level. When the voltage Vout is equal to input voltage Vin, the pull-high circuit shown in FIG. 5 is turned off.

Figure 6:
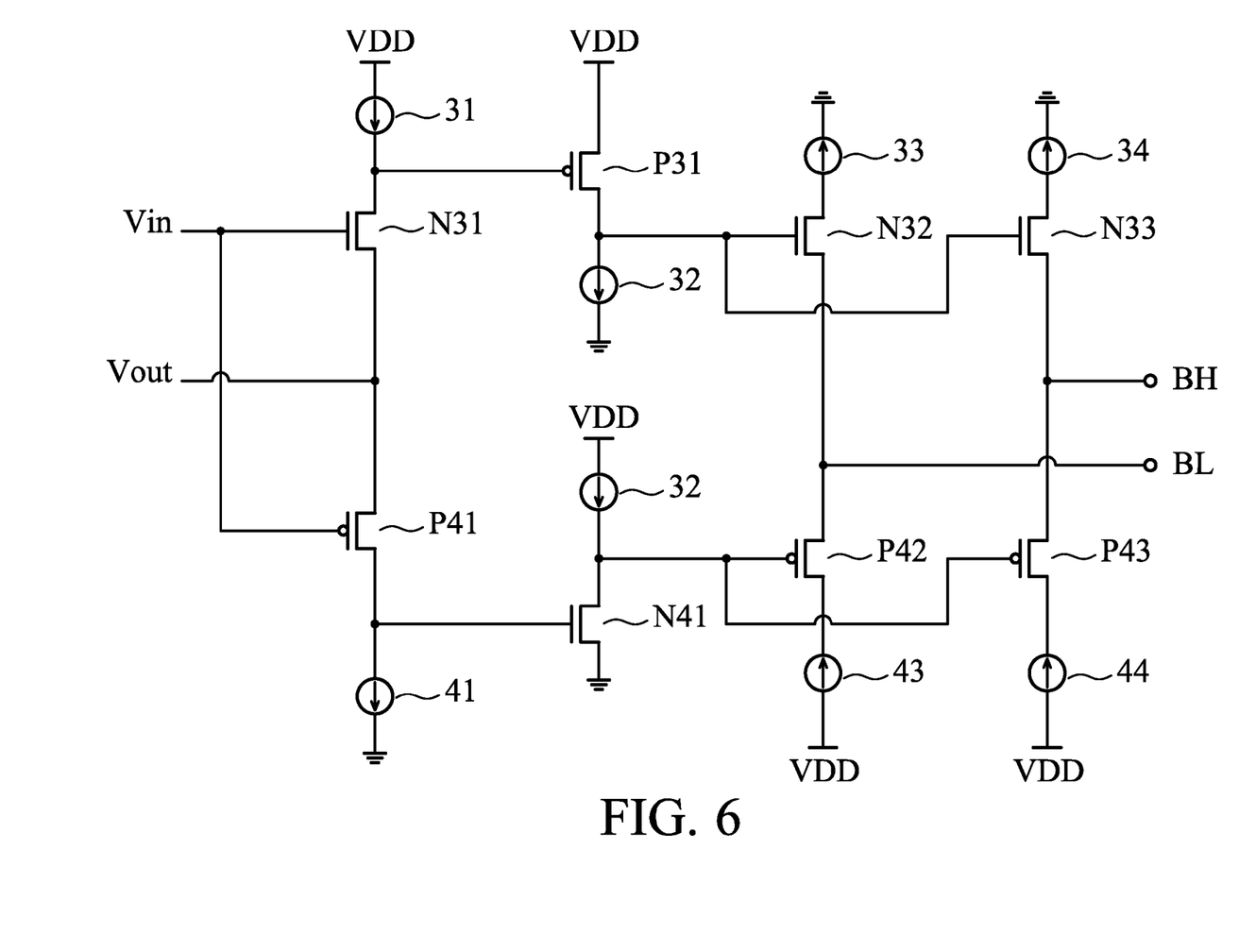
FIG. 6 is a circuit diagram of a high driving auxiliary circuit according to an embodiment of the invention.

FIG. 6 is a circuit diagram of a high driving auxiliary circuit according to an embodiment of the invention. It is noted that the circuit shown in FIG. 6 is a combination circuit of FIGS. 4 and 5, but the invention is not limited thereto. The detailed circuitry of FIG. 6 is not described here for brevity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit, comprising:
   an operational amplifier comprising a positive input terminal receiving an input voltage and a negative input terminal coupled to an output terminal of the operational amplifier for outputting an output voltage;

a PMOS transistor comprising a first source terminal coupled to a high voltage source providing a high voltage, a first gate terminal coupled to a first node of the operational amplifier, and a first drain terminal coupled to the output terminal of the operational amplifier;

an NMOS transistor comprising a second source terminal coupled to a low voltage source that is grounded, a second gate terminal coupled to a second node of the operational amplifier, and a second drain terminal coupled to the output terminal of the operational amplifier; and a driving auxiliary circuit receiving the input voltage and the output voltage and coupled to the first node and the second node, wherein the driving auxiliary circuit pulls down the voltage level of the first node and second node to a first voltage level when the input voltage exceeds the output voltage, and the driving auxiliary circuit pulls up the voltage level of the first node and second node to a second voltage level when the output voltage exceeds the input voltage, wherein a pull-low circuit comprises:

a first current source coupled to the low voltage source;

a first switch coupled between the first current source and the first node;

a second current source coupled to the low voltage source; and a second switch coupled between the second current source and the second node, wherein the first switch and the second switch are turned on when the input voltage exceeds the output voltage.

2. The driving circuit as claimed in claim 1, wherein the first voltage level is a low voltage level.

3. The driving circuit as claimed in claim 1, wherein the second voltage level is a high voltage level.

4. The driving circuit as claimed in claim 1, wherein the driving auxiliary circuit comprises a pull-low circuit for pulling down the voltage levels of the first node and the second node to the first voltage level.

5. The driving circuit as claimed in claim 4, wherein the pull-low circuit comprises:

a first current source coupled to the high voltage source;

a first transistor comprising a first first terminal coupled to the first current source, a first control terminal receiving the input voltage, and a first second terminal coupled to the output terminal of the operational amplifier;

a second transistor comprising a second first terminal coupled to the high voltage source, a second control terminal coupled to the first current source, and a second second terminal;

a second current source coupled to the second terminal of the second transistor and the lower voltage source;

a third transistor comprising a third first terminal coupled to the first node, a third control terminal coupled to the second terminal of the second transistor, and a third second terminal;

a third current source coupled between the third second terminal of the third transistor and the lower voltage source;

a fourth transistor comprising a fourth first terminal coupled to the second node, a fourth control terminal coupled to the second terminal of the second transistor, and a fourth second terminal; and a fourth current source coupled between the fourth second terminal of the fourth transistor and the lower voltage source.

6. The driving circuit as claimed in claim 4, wherein the first voltage level is a ground level.

7. The driving circuit as claimed in claim 1, wherein the driving auxiliary circuit comprises a pull-high circuit for pulling up the voltage level of the first node and second node to the second voltage level.

8. The driving circuit as claimed in claim 7, wherein the pull-high circuit comprises:

a fifth current source coupled to the low voltage source;

a fifth transistor comprising a fifth first terminal coupled to the fifth current source, a fifth control terminal receiving the input voltage, and a fifth second terminal coupled to the output terminal of the operational amplifier;

a sixth transistor comprising a sixth first terminal coupled to the low voltage source, a sixth control terminal coupled to the fifth first terminal of the fifth transistor, and a sixth second terminal;

a sixth current source coupled between the sixth second terminal of the sixth transistor and the high voltage source;

a seventh transistor comprising a seventh first terminal coupled to the first node, a seventh control terminal coupled to the sixth second terminal of the sixth transistor, and a seventh second terminal;

a seventh current source coupled between the seventh second terminal of the seventh transistor and the high voltage source;

an eighth transistor comprising an eighth first terminal coupled to the second node, an eighth control terminal coupled to the sixth second terminal of the sixth transistor, and an eighth second terminal; and an eighth current source coupled between the eighth second terminal of the eighth transistor and the high voltage source.

9. The driving circuit as claimed in claim 7, wherein the pull-high circuit comprises:

a third current source coupled to the high voltage source;

a third switch coupled between the third current source and the first node;

a fourth current source coupled to the high voltage source; and a fourth switch coupled between the fourth current source and the second node, wherein the third switch and the fourth switch are turned on when the output voltage exceeds the input voltage.

10. A driving auxiliary circuit receiving an input voltage to control an output voltage of an operational amplifier via a first switch and a second switch, comprising:

a pull-low circuit to turn on the first switch, comprising a first input terminal coupled to a high voltage source providing a high voltage and a first output terminal for controlling the voltage level of the output voltage, wherein the output voltage is charged to be equal to the input voltage when the input voltage exceeds the output voltage; and a pull-high circuit to turn on the second switch, comprising a second input terminal coupled to the high voltage source and a second output terminal for controlling the voltage level of the output voltage, wherein the output voltage is discharged to be equal to the input voltage when the output voltage exceeds the input voltage;

wherein the pull-low circuit comprises:

a first current source coupled to the low voltage source;

a first switch coupled between the first current source and the first node;

a second current source coupled to the low voltage source; and a second switch coupled between the second current source and the second node, wherein the first switch and the second switch are turned on when the input voltage exceeds the output voltage.

11. The driving auxiliary circuit as claimed in claim 10, wherein the first switch is a PMOS transistor comprising a first source terminal coupled to a high voltage source providing a high voltage, a first gate terminal coupled to a first node of the operational amplifier, and a first drain terminal coupled to the output terminal of the operational amplifier.

12. The driving auxiliary circuit as claimed in claim 11, wherein the second switch is an NMOS transistor comprising a second source terminal coupled to a low voltage source that is grounded, a second gate terminal coupled to a second node of the operational amplifier, and a second drain terminal coupled to the output terminal of the operational amplifier.

13. The driving auxiliary circuit as claimed in claim 12, wherein the pull-low circuit pulls down the voltage levels of the first node and the second node to a relatively low voltage level, and the pull-high circuit pulls up the voltage level of the first node and second node to a relatively high voltage level.

14. The driving auxiliary circuit as claimed in claim 10, wherein the pull-low circuit comprises:

a first current source coupled to the high voltage source;

a first transistor comprising a first terminal coupled to the first current source, a first control terminal receiving the input voltage, and a first second terminal coupled to the output terminal of the operational amplifier;

a second transistor comprising a second first terminal coupled to the high voltage source, a second control terminal coupled to the first current source, and a second terminal;

a second current source coupled to the second terminal of the second transistor and the lower voltage source;

a third transistor comprising a third first terminal coupled to the first node, a third control terminal coupled to the second terminal of the second transistor, and a third second terminal;

a third current source coupled between the third second terminal of the third transistor and the lower voltage source;

a fourth transistor comprising a fourth first terminal coupled to the second node, a fourth control terminal coupled to the second terminal of the second transistor, and a fourth second terminal; and a fourth current source coupled between the fourth second terminal of the fourth transistor and the lower voltage source.

15. The driving auxiliary circuit as claimed in claim 10, wherein the pull-high circuit comprises:

a fifth current source coupled to the low voltage source;

a fifth transistor comprising a fifth first terminal coupled to the fifth current source, a fifth control terminal receiving the input voltage, and a fifth second terminal coupled to the output terminal of the operational amplifier;

a sixth transistor comprising a sixth first terminal coupled to the low voltage source, a sixth control terminal coupled to the fifth first terminal of the fifth transistor, and a sixth second terminal;

a sixth current source coupled between the sixth second terminal of the sixth transistor and the high voltage source;

a seventh transistor comprising a seventh first terminal coupled to the first node, a seventh control terminal coupled to the sixth second terminal of the sixth transistor, and a seventh second terminal;

a seventh current source coupled between the seventh second terminal of the seventh transistor and the high voltage source;

an eighth transistor comprising an eighth first terminal coupled to the second node, an eighth control terminal coupled to the sixth second terminal of the sixth transistor, and an eighth second terminal; and an eighth current source coupled between the eighth second terminal of the eighth transistor and the high voltage source.

\* \* \* \* \*